United States Patent
Lu et al.

(10) Patent No.: US 10,134,801 B2
(45) Date of Patent: Nov. 20, 2018

(54) METHOD OF FORMING DEEP TRENCH ISOLATION IN RADIATION SENSING SUBSTRATE AND IMAGE SENSOR DEVICE

(71) Applicant: TAIWAN SEMICONDUCTOR MANUFACTURING CO., LTD., Hsinchu (TW)

(72) Inventors: Chi-Ming Lu, Kaohsiung (TW); Chih-Hui Huang, Tainan (TW); Jung-Chih Tsao, Tainan (TW); Yao-Hsiang Liang, Hsinchu (TW); Chih-Chang Huang, Chiayi (TW); Ching-Ho Hsu, Hsinchu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 0 days.

(21) Appl. No.: 15/048,936

(22) Filed: Feb. 19, 2016

(65) Prior Publication Data
US 2017/0154917 A1 Jun. 1, 2017

Related U.S. Application Data

(60) Provisional application No. 62/261,204, filed on Nov. 30, 2015.

(51) Int. Cl.
*H01L 27/146* (2006.01)

(52) U.S. Cl.
CPC .... *H01L 27/14685* (2013.01); *H01L 27/1463* (2013.01); *H01L 27/14629* (2013.01)

(58) Field of Classification Search
CPC ............. H01L 27/14685; H01L 27/14629
See application file for complete search history.

(56) References Cited

U.S. PATENT DOCUMENTS

| 6,436,819 | B1 | 8/2002 | Zhang et al. |
| 9,570,493 | B2 * | 2/2017 | Cheng .............. H01L 27/14629 |
| 2010/0213541 | A1 | 8/2010 | Jeon et al. |
| 2013/0241018 | A1 * | 9/2013 | JangJian ........... H01L 27/14621 257/432 |
| 2013/0285181 | A1 * | 10/2013 | Lin .................... H01L 27/1463 257/432 |
| 2015/0001660 | A1 | 1/2015 | Fukumizu et al. |
| 2015/0028405 | A1 | 1/2015 | Minami et al. |
| 2015/0049229 | A1 * | 2/2015 | Liu ................... H01L 27/14685 348/308 |

(Continued)

FOREIGN PATENT DOCUMENTS

| JP | 10 074709 A | 3/1998 |
| KR | 10 2001 0078247 | 8/2001 |

(Continued)

*Primary Examiner* — Peter Bradford
(74) *Attorney, Agent, or Firm* — Cooper Legal Group, LLC

(57) ABSTRACT

A method of forming a deep trench isolation in a radiation sensing substrate includes: forming a trench in the radiation sensing substrate; forming a corrosion resistive layer in the trench, in which the corrosion resistive layer includes titanium carbon nitride having a chemical formula of $TiC_xN_{(2-x)}$, and x is in a range of 0.1 to 0.9; and filling a reflective material in the trench and over the corrosion resistive layer.

20 Claims, 3 Drawing Sheets

(56) References Cited

U.S. PATENT DOCUMENTS

2015/0197720 A1\* 7/2015 Chiou .................... C12M 35/02
                                                                                                        435/173.6
2015/0255495 A1    9/2015 Park
2016/0276394 A1\* 9/2016 Chou ................ H01L 27/14645

FOREIGN PATENT DOCUMENTS

| KR | 10 2015 0012993 | 2/2015 |
| KR | 10 2015 0105076 | 9/2015 |

\* cited by examiner

METHOD OF FORMING DEEP TRENCH ISOLATION IN RADIATION SENSING SUBSTRATE AND IMAGE SENSOR DEVICE

RELATED APPLICATIONS

This application claims priority to U.S. Provisional Application Ser. No. 62/261,204, filed Nov. 30, 2015, which is herein incorporated by reference.

BACKGROUND

Semiconductor image sensors are used to sense radiation such as light. Complementary metal-oxide-semiconductor (CMOS) image sensors (CIS) and charged-coupled device (CCD) sensors are widely used in various applications such as digital camera or mobile phone camera applications. These devices utilize an array of pixels in a substrate, including photodiodes and transistors, to absorb radiation projected towards the substrate and convert the sensed radiation into electrical signals.

A backside-illuminated (BSI) image-sensor device is one type of image-sensor device. The BSI image-sensor device is used for sensing a volume of light projected towards a backside surface of a substrate (which supports the image sensor circuitry of the BSI image-sensor device). The pixel grid is located at a front side of the substrate, and the substrate is thin enough so that light projected towards the backside of the substrate can reach the pixel grid. The BSI image-sensor device provides a high fill factor and reduced destructive interference, as compared to frontside-illuminated (FSI) image-sensor devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
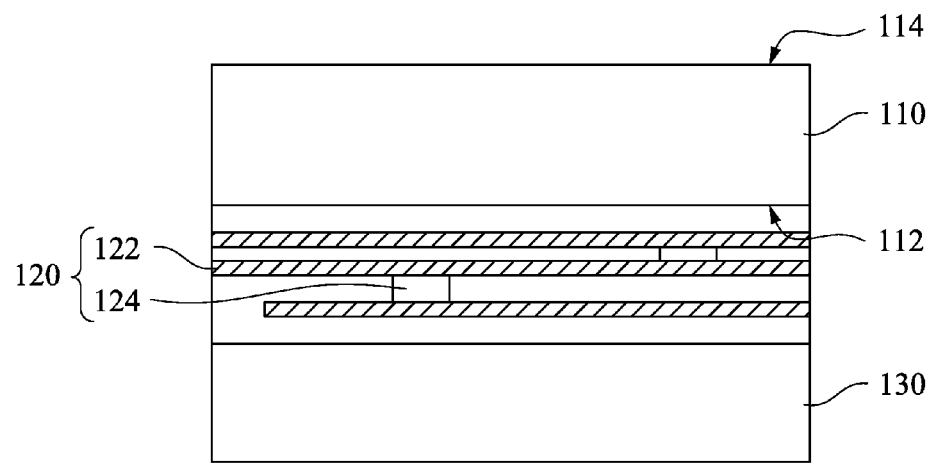
FIGS. 1A to 1E are cross-sectional views at various stages of forming a deep trench isolation (DTI) in a radiation sensing substrate in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A common defect of an image sensor device is optical cross talk. "Optical cross talk" refers to photon interference from neighboring pixels that degrades light sensing reliability and accuracy of the pixels. In some embodiments, a deep trench isolation (DTI) is formed in a radiation sensing substrate to prevent undesired optical cross talk.

In some embodiments, a reflective material, such as metal (e.g., tungsten) or alloy, is formed in the deep trench or over the radiation sensing substrate to increase reflected area. However, when the reflective material is formed (e.g., using chemical vapor deposition), the radiation sensing substrate may be damaged. The damage of the radiation sensing substrate may lead to excessive amount of current leakage, and thus causes abnormally high signal from the pixels to form white pixels. Therefore, the present disclosure provides a method of forming a deep trench isolation in a radiation sensing substrate, which includes forming a corrosion resistive layer in a trench to protect the radiation sensing substrate when a reflective material is formed. Embodiments of the method of forming the deep trench isolation in the radiation sensing substrate will be described in detail below.

FIGS. 1A to 1E are cross-sectional views at various stages of forming a deep trench isolation in a radiation sensing substrate in accordance with some embodiments of the present disclosure.

In some embodiments, as shown in FIG. 1A, a radiation sensing substrate 110 is received or provided. In some embodiments, the radiation sensing substrate 110 includes an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or a combination thereof. In some embodiments, the radiation sensing substrate 110 includes a semiconductor substrate. In some embodiments, the radiation sensing substrate 110 includes a semiconductor substrate doped with p-type dopants, such as boron. In some embodiments, the radiation sensing substrate 110 includes a semiconductor substrate doped with n-type dopants, such as phosphorous or arsenic. In some embodiments, the radiation sensing substrate 110 includes an epitaxial (epi) layer, strained for performance enhancement. In some embodiments, the radiation sensing substrate 110 includes a silicon-on-insulator (SOI) structure. In some embodiments, the radiation sensing substrate 110 is a device substrate. In some embodiments, the radiation sensing substrate 110 is fabricated using front-end processes.

In some embodiments, the radiation sensing substrate 110 includes a front surface 112 (also referred to as a frontside) and a back surface 114 (also referred to as a backside) opposite to each other. In some embodiments, incident radiation enters the radiation sensing substrate 110 through the back surface 114. In some embodiments, the radiation sensing substrate 110 includes a pixel region, a periphery region, a bonding pad region and a scribe line region. For the sake of simplicity, only a portion of the pixel region in shown in FIGS. 1A to 1E. Although only the portion of the pixel region is shown in FIGS. 1A to 1E, the pixel region may further include pinned layer photodiodes, photodiode gates, reset transistors, source follower transistors and transfer transistors. For the sake of simplicity, detailed structures of the above features are not shown in FIGS. 1A to 1E.

In some embodiments, the radiation sensing substrate 110 includes a radiation sensing region (not shown). In some embodiments, the radiation sensing region is doped with dopants different from (or opposite to) dopants of the semiconductor substrate of the radiation sensing substrate 110. In some embodiments, the radiation sensing region is formed using one or more implantation processes or diffusion processes. In some embodiments, the radiation sensing region is formed adjacent to the front surface 112. In some embodiments, the radiation sensing regions are operable to sense incident radiation that enters the pixel region from the back surface 114. In some embodiments, the incident radiation is visual light. Alternatively, the incident radiation may be infrared (IR), ultraviolet (UV), X-ray, microwave, other suitable types of radiation or a combination thereof.

In some embodiments, the radiation sensing substrate 110 further includes an isolation region (not shown) laterally adjacent to the radiation sensing region. In some embodiments, the isolation region is doped with dopants the same as dopants of the semiconductor substrate of the radiation sensing substrate 110. In some embodiments, the isolation region is formed using one or more implantation processes or diffusion processes. In some embodiments, the isolation region is formed adjacent to the front surface 112.

In some embodiments, the radiation sensing substrate 110 further includes an isolation feature (not shown) in the isolation region. In some embodiments, the isolation feature is adjacent to the front surface 112 of the radiation sensing substrate 110. In some embodiments, the isolation feature includes shallow trench isolation (STI) structure and/or local oxidation of silicon (LOCOS) structure. In some embodiments, some active or passive features, such as MOSFET or junction capacitor, are formed in the isolation region according to design needs. In some embodiments, the active or passive features in the isolation region are protected by the isolation feature.

In some embodiments, an interconnection structure 120 is formed over the front surface 112 of the radiation sensing substrate 110. In some embodiments, the interconnection structure 120 includes an inter layer dielectric (ILD) and multilayer interconnection (MLI) structure. In some embodiments, the interconnection structure 120 includes conductive lines 122 and vias/contacts 124. Actual position and configuration of the conductive lines 122 and the vias/contacts 124 may vary depending on design needs and manufacturing concerns.

In some embodiments, another substrate 130 is bonded to the interconnection structure 120. In some embodiments, the substrate 130 is a carrier substrate. In some embodiments, the substrate 130 includes application specific integrated circuits (ASIC). In some embodiments, the substrate 130 is bonded to the interconnection structure 120 by direct bonding, optical fusion bonding, metal diffusion bonding, anodic bonding or other suitable bonding techniques. In some embodiments, the substrate 130 is configured to provide protection for the radiation sensing substrate 110 and the interconnection structure 120. In some embodiments, the substrate 130 is configured to provide support when following processes are performed on the back surface 114 of the radiation sensing substrate 110.

Figure 1B:
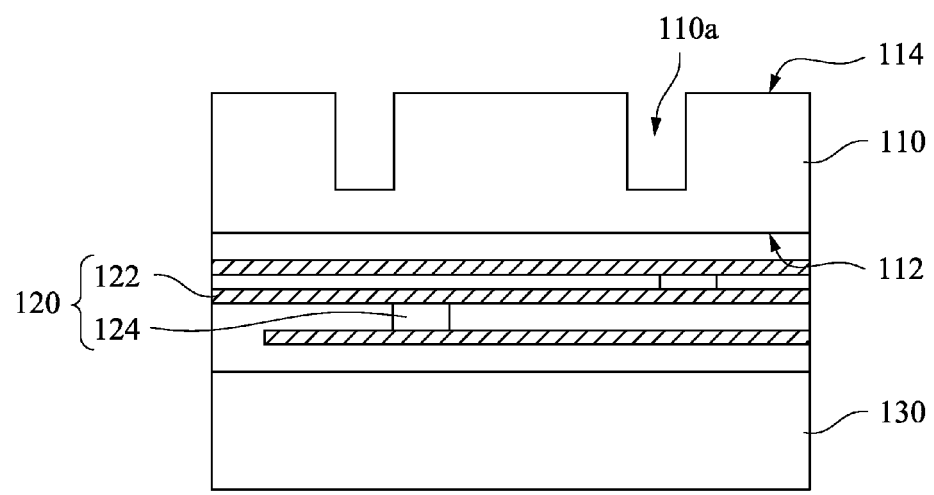

As shown in FIGS. 1A to 1B, a trench 110a is formed in the radiation sensing substrate 110. In some embodiments, the trench 110a is formed using a material removal process, such as an etching process. In some embodiments, the etching process includes a dry etching process, a wet etching process or a combination thereof. In some embodiments, the trench 110a has a rectangular shape, a trapezoidal shape or other suitable shape in cross-sectional view. In some embodiments, the trench 110a extends over half of the thickness of the radiation sensing substrate 110. The trench 110a is used for forming the deep trench isolation, which will be described below in detail.

Figure 1C:
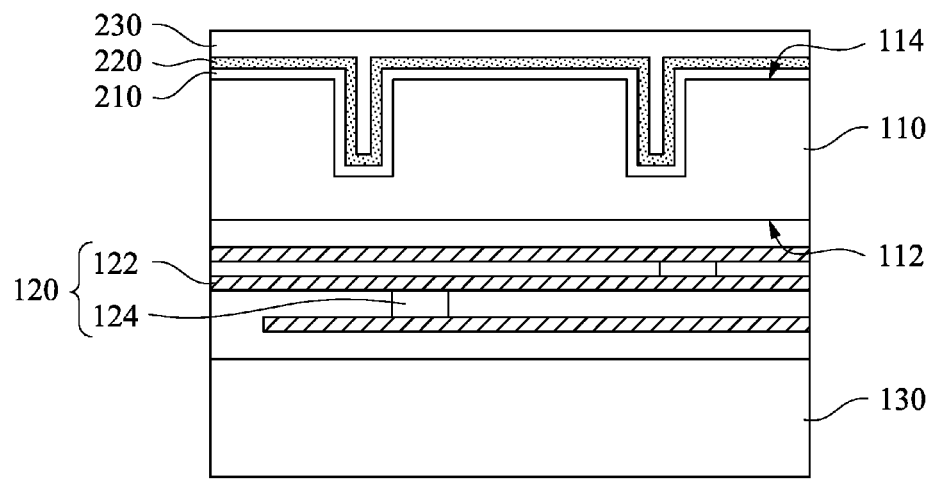

As shown in FIGS. 1B to 1C, a corrosion resistive layer 220 is formed in the trench 110a. In some embodiments, the corrosion resistive layer 220 is also formed over the back surface 114 of the radiation sensing substrate 110. In some embodiments, the corrosion resistive layer 220 is formed in a conformal manner covering an interior surface of the trench 110a and the back surface 114. In some embodiments, the corrosion resistive layer 220 includes titanium carbon nitride having a chemical formula of $TiC_xN_{(2-x)}$. In some embodiments, x is in a range of 0.1 to 0.9. In some embodiments, x is in a range of 0.2 to 0.8. In some embodiments, the corrosion resistive layer 220 includes 15 to 40 at % of carbon. In some embodiments, the corrosion resistive layer 220 includes 15 to 40 at % of nitrogen. In some embodiments, the corrosion resistive layer 220 includes 20 to 40 at % of titanium.

In some embodiments, forming the corrosion resistive layer 220 in the trench 110a includes: forming a titanium carbon nitride-containing layer (not shown) in the trench 110a; and performing a plasma treatment with hydrogen on the titanium carbon nitride-containing layer to convert the titanium carbon nitride-containing layer to the corrosion resistive layer 220.

In some embodiments, the titanium carbon nitride-containing layer is formed using physical vapor deposition (PVD), chemical vapor deposition (CVD), atomic layer deposition (ALD), other suitable deposition technique or a combination thereof. The CVD process includes plasma enhanced chemical vapor deposition (PECVD) or low-pressure chemical vapor deposition (LPCVD). In some embodiments, the titanium carbon nitride-containing layer is formed using CVD with titanium carbon nitride precursor and ammonia. In some embodiments, the titanium carbon nitride precursor includes tetrakis(dimethylamino)titanium (TDMAT), tetrakis(diethylamino)titanium (TDEAT), other suitable titanium carbon nitride precursor or a combination thereof.

In some embodiments, the plasma treatment with hydrogen has a plasma power. In some embodiments, the plasma power of the plasma treatment is RF power. In some embodiments, the plasma power of the plasma treatment is lower than 1,550 W. In some embodiments, the plasma power of the plasma treatment is lower than or equal to 1,450 W. In some embodiments, the plasma power of the plasma treatment is greater than 1,000 W. In some embodiments, the plasma treatment is further with nitrogen. In some embodiments, the plasma treatment with hydrogen is used to perform reduction of carbon. In some embodiments, the plasma treatment with hydrogen is used to adjust an amount of carbon of titanium carbon nitride of the corrosion resistive layer 220. In some embodiments, the plasma treatment with hydrogen is used to decrease an amount of carbon of titanium carbon nitride of the corrosion resistive layer 220.

In some embodiments, before the corrosion resistive layer 220 is formed in the trench 110a, a dielectric material 210 is formed in the trench 110a. In some embodiments, the dielectric material 210 includes silicon oxide, silicon nitride, silicon oxynitride, spin on glass (SOG), low k dielectric, other suitable dielectric material or a combination thereof. In some embodiments, the dielectric material 210 includes silicon oxide. In some embodiments, the dielectric material 210 is formed using a CVD process or a PVD process. In some embodiments, the dielectric material 210 has a thickness in a range of 200 angstroms to 1,000 angstroms. In some embodiments, the dielectric material 210 and the corrosion resistive layer 220 in the trench 110a are collectively referred to as the deep trench isolation.

In some embodiments, before the dielectric material 210 is formed in the trench 110a, a high k metal oxide layer (not shown) is formed in the trench 110a. In some embodiments, the high-k metal oxide includes hafnium oxide, aluminum oxide, zirconium oxide, magnesium oxide, calcium oxide, yttrium oxide, tantalum oxide, strontium oxide, titanium oxide, lanthanum oxide, barium oxide, other suitable metal oxide or a combination thereof. In some embodiments, the high k metal oxide layer is formed using a CVD process or a PVD process. In some embodiments, the high k metal oxide layer, the dielectric material 210 and the corrosion resistive layer 220 in the trench 110a are collectively referred to as the deep trench isolation.

In some embodiments, as shown in FIG. 1C, after the corrosion resistive layer 220 is formed in the trench 110a, a reflective material 230 is formed in the trench 110a and over the corrosion resistive layer 220. In some embodiments, the reflective material 230 fills the trench 110a. In some embodiments, the reflective material 230 filled in the trench 110a is configured to extend reflected area. In some embodiments, the reflective material 230 includes tungsten, aluminum, copper, tantalum, titanium, other suitable metal or a combination thereof. In some embodiments, the reflective material 230 is formed using sputtering, electroplating, CVD, PVD or other suitable deposition technique. In some embodiments, the dielectric material 210, the corrosion resistive layer 220 and the reflective material 230 in the trench 110a are collectively referred to as the deep trench isolation.

It is noteworthy that because of the corrosion resistive layer 220, the radiation sensing substrate 110 is not damaged when the reflective material 230 is formed, and thus to prevent occurrence of white pixel defects. In some embodiments, the corrosion resistive layer 220 can block reaction gas, such as $WF_6$ for forming tungsten, and thus the radiation sensing substrate 110 will not be damaged.

Figure 1D:
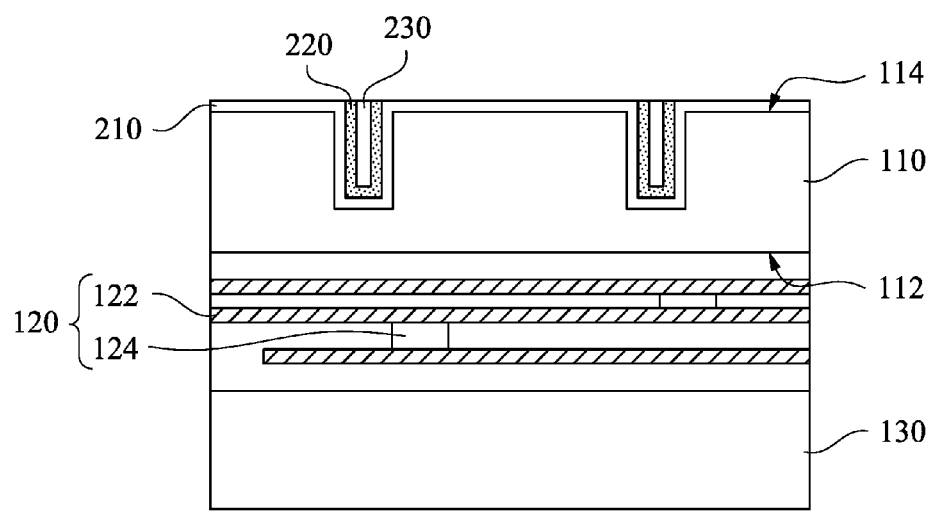

In some embodiments, as shown in FIGS. 1C to 1D, a planarization process is performed on the reflective material 230 and the corrosive resistive layer 220. In some embodiments, the planarization process includes a chemical mechanical polish (CMP) process, a grinding process, an etching process, any other suitable material removal process or a combination thereof. In some embodiments, after the planarization process is performed, an upper surface of the dielectric material 210 is exposed.

Figure 1E:
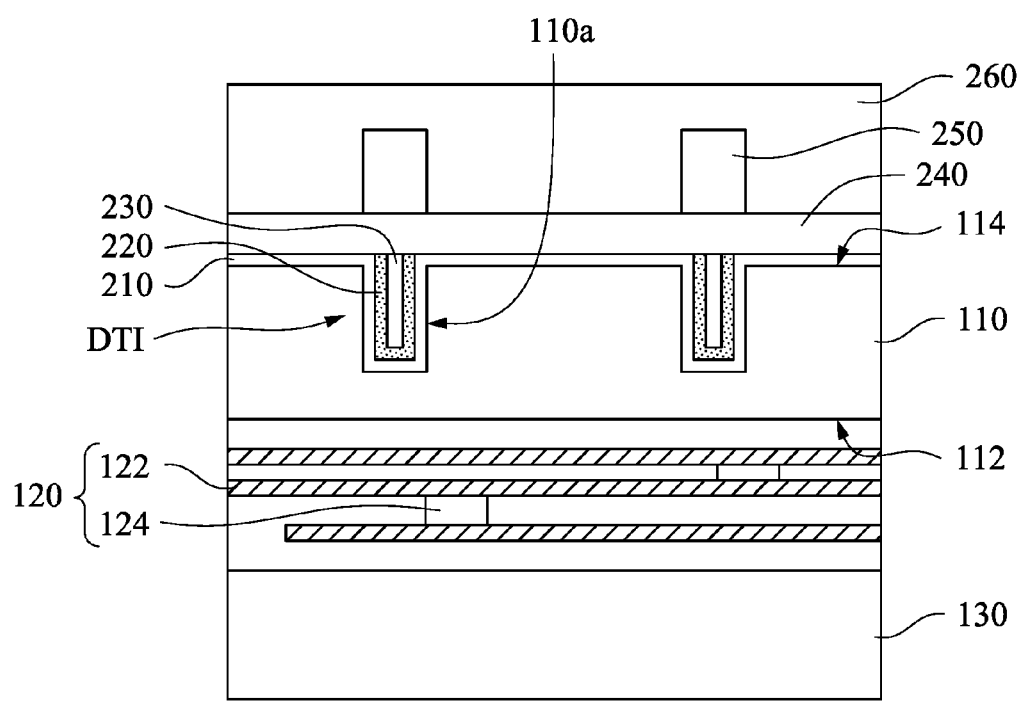

In some embodiments, as shown in FIGS. 1D to 1E, another dielectric material 240 is formed over the dielectric material 210, the corrosion resistive layer 220 and the reflective material 230. In some embodiments, the dielectric material 240 includes silicon oxide, silicon nitride, silicon oxynitride, spin on glass (SOG), low k dielectric, other suitable dielectric material or a combination thereof. In some embodiments, the dielectric material 240 includes silicon oxide. In some embodiments, the dielectric material 240 is formed using a CVD process or a PVD process.

In some embodiments, as shown in FIG. 1E, a reflective grid 250 is formed over the dielectric material 240. In some embodiments, the reflective grid 250 is substantially or entirely aligned with the trench 110a. In some embodiments, the reflective grid 250 includes tungsten, aluminum, copper, tantalum, titanium, titanium nitride, other suitable material or a combination thereof. In some embodiments, the reflective grid 250 is formed using a deposition process, such as sputtering, electroplating, CVD, PVD, plasma or other suitable deposition technique, and a patterning process, such as photolithographic and etching processes.

In some embodiments, after the reflective grid 250 is formed, a protective layer 260 is formed over the reflective grid 250. In some embodiments, the protective layer 260 includes silicon oxide, silicon nitride, silicon oxynitride, spin on glass (SOG), low k dielectric, other suitable dielectric material or a combination thereof. In some embodiments, the protective layer 260 is formed using a CVD process or a PVD process. In some embodiments, the protective layer 260 is a low deposition rate resistor protection oxide (LRPO). In some embodiments, the protective layer 260 has a thickness greater than or equal to 1,000 angstroms.

In some embodiments, after the protective layer 260 is performed, a color filter layer (not shown) and a micro lens layer (not shown) are sequentially formed over the protective layer 260. The color filter layer is configured to allow radiation with predetermined wavelengths to reach the radiation sensing substrate 110. The micro lens layer is configured to direct incident radiation toward the radiation sensing substrate 110. Alternatively, the position of the color filter layer and that of the micro lens layer may be reversed, and thus the micro lens layer is between the color filter layer and the protective layer 260.

Embodiments of an image sensor device will be described in detail below. In some embodiments, an image sensor device is a backside-illuminated (BSI) image-sensor device. In some embodiments, the BSI image sensor device includes a charge-coupled device (CCD), a complementary metal oxide semiconductor (CMOS) image sensor (CIS), an active-pixel sensor (APS) or a passive-pixel sensor. In some embodiments, the image sensor device includes additional circuitry and input/outputs that are provided adjacent to grid of pixels for providing an operation environment of the pixels and for supporting external communication with the pixels.

As shown in FIG. 1E, the image sensor device includes a radiation sensing substrate 110 and a deep trench isolation DTI. In some embodiments, the radiation sensing substrate 110 includes a semiconductor substrate. In some embodiments, the radiation sensing substrate 110 is a device substrate. In some embodiments, the radiation sensing substrate 110 includes a pixel region, a periphery region, a bonding pad region and a scribe line region. For the sake of simplicity, only a portion of the pixel region in shown in FIG. 1E.

The radiation sensing substrate 110 includes a front surface 112 and a back surface 114 opposite to each other. In some embodiments, incident radiation enters the radiation sensing substrate 110 through the back surface 114. In some embodiments, the radiation sensing substrate 110 includes a radiation sensing region (not shown).

The deep trench isolation DTI includes a trench 110a and a titanium carbon nitride layer 220 in the trench 110a. The trench 110a extends from the back surface 114 into the radiation sensing substrate 110. In some embodiments, the titanium carbon nitride layer 220 in the trench 110a is in a conformal manner. In some embodiments, the titanium carbon nitride of the titanium carbon nitride layer 220 has a chemical formula of $TiC_xN_{(2-x)}$, and x is in a range of 0.1 to 0.9. In some embodiments, x is in a range of 0.2 to 0.8. In some embodiments, x is in a range of 0.3 to 0.7. White pixel defects may be significantly improved by using the titanium carbon nitride of the titanium carbon nitride layer 220 with a chemical formula of $TiC_xN_{(2-x)}$, in which x is in a range of 0.1 to 0.9.

In some embodiments, the titanium carbon nitride layer 220 includes 15 to 40 at % of carbon. In some embodiments, the titanium carbon nitride layer 220 includes 20 to 40 at % of carbon. In some embodiments, the titanium carbon nitride layer 220 includes 15 to 40 at % of nitrogen. In some embodiments, the titanium carbon nitride layer 220 includes 20 to 40 at % of nitrogen. In some embodiments, the titanium carbon nitride layer 220 includes 20 to 40 at % of titanium. In some embodiments, the titanium carbon nitride layer 220 includes 30 to 40 at % of titanium. In some embodiments, in the titanium carbon nitride layer 220, a difference between an amount of carbon and an amount of nitrogen is lower than or equal to 10 at %. In some embodiments, in the titanium carbon nitride layer 220, an amount of titanium is greater than an amount of carbon. In some embodiments, in the titanium carbon nitride layer 220, an amount of titanium is greater than an amount of nitrogen. In some embodiments, in the titanium carbon nitride layer 220, an amount of nitrogen is greater than an amount of carbon.

In some embodiments, the deep trench isolation DTI further includes a dielectric material 210 between the titanium carbon nitride layer 220 and an interior surface of the trench 110a. In some embodiments, the dielectric material 210 in the trench 110a is in a conformal manner. In some embodiments, the dielectric material 210 includes silicon oxide, silicon nitride, silicon oxynitride, spin on glass (SOG), low k dielectric, other suitable dielectric material or a combination thereof.

In some embodiments, the deep trench isolation DTI further includes a high k metal oxide layer (not shown) between the dielectric material 210 and the interior surface of the trench 110a. In some embodiments, the high k metal oxide layer in the trench 110a is in a conformal manner. In some embodiments, the high-k metal oxide includes hafnium oxide, aluminum oxide, zirconium oxide, magnesium oxide, calcium oxide, yttrium oxide, tantalum oxide, strontium oxide, titanium oxide, lanthanum oxide, barium oxide, other suitable metal oxide or a combination thereof.

In some embodiments, the deep trench isolation DTI further includes a reflective material 230 in the trench 110a and over the titanium carbon nitride layer 220. In some embodiments, the reflective material 230 fills the trench 110a. In some embodiments, the reflective material 230 includes tungsten, aluminum, copper, tantalum, titanium, other suitable metal or a combination thereof. In some embodiments, the reflective material 230 is in contact with the titanium carbon nitride layer 220.

In some embodiments, the image sensor device further includes another dielectric material 240 over the dielectric material 210. In some embodiments, the dielectric material 240 includes silicon oxide, silicon nitride, silicon oxynitride, spin on glass (SOG), low k dielectric, other suitable dielectric material or a combination thereof.

In some embodiments, the image sensor device further includes a reflective grid 250 over the dielectric material 240. In some embodiments, the reflective grid 250 is substantially or entirely aligned with the trench 110a. In some embodiments, the reflective grid 250 includes tungsten, aluminum, copper, tantalum, titanium, other suitable metal or a combination thereof.

In some embodiments, the image sensor device further includes a protective layer 260 over the reflective grid 250. In some embodiments, the protective layer 260 includes silicon oxide, silicon nitride, silicon oxynitride, spin on glass (SOG), low k dielectric, other suitable dielectric material or a combination thereof.

In some embodiments, the image sensor device further includes a color filter layer (not shown) and a micro lens layer (not shown) over the protective layer 260. The color filter layer is configured to allow radiation with predetermined wavelengths to reach the radiation sensing substrate 110. The micro lens layer is configured to direct incident radiation toward the radiation sensing substrate 110.

In some embodiments, the image sensor device further includes an interconnection structure 120 over the front surface 112 of the radiation sensing substrate 110. In some embodiments, the interconnection structure 120 includes an inter layer dielectric (ILD) and multilayer interconnection (MLI) structure. In some embodiments, the interconnection structure 120 includes conductive lines 122 and vias/contacts 124, which may be coupled to various doped features, circuitry and input/output of the image sensor device.

In some embodiments, the image sensor device further includes another substrate 130 over the interconnection structure 120. In some embodiments, the substrate 130 is a carrier substrate. In some embodiments, the substrate 130 is an application specific integrated circuits (ASIC) substrate.

According to some embodiments, a method of forming a deep trench isolation in a radiation sensing substrate includes: forming a trench in the radiation sensing substrate; forming a corrosion resistive layer in the trench, in which the corrosion resistive layer includes titanium carbon nitride having a chemical formula of $TiC_xN_{(2-x)}$, and x is in a range of 0.1 to 0.9; and filling a reflective material in the trench and over the corrosion resistive layer.

According to some embodiments, a method of forming a deep trench isolation in a radiation sensing substrate includes: forming a trench in the radiation sensing substrate; forming a titanium carbon nitride-containing layer in the trench; and performing a plasma treatment with hydrogen on the titanium carbon nitride-containing layer to convert the titanium carbon nitride-containing layer to a corrosion resistive layer; and filling a reflective material in the trench and over the corrosion resistive layer.

According to some embodiments, an image sensor device includes a radiation sensing substrate and a deep trench isolation. The radiation sensing substrate has a front surface and a back surface. The deep trench isolation is in the radiation sensing substrate. The deep trench isolation includes a trench extending from the back surface into the radiation sensing substrate and a titanium carbon nitride layer in the trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device, comprising:
a radiation sensing substrate having a front surface and a back surface; and
a deep trench isolation in the radiation sensing substrate, the deep trench isolation comprising:
a trench extending from the back surface into the radiation sensing substrate; and
a corrosion resistive layer in the trench, wherein the corrosion resistive layer is a titanium carbon nitride layer.

2. The image sensor device of claim 1, wherein titanium carbon nitride of the titanium carbon nitride layer has a chemical formula of $TiC_xN_{(2-x)}$, and x is in a range of 0.1 to 0.9.

3. The image sensor device of claim 2, wherein x is in a range of 0.2 to 0.8.

4. The image sensor device of claim 1, wherein the titanium carbon nitride layer comprises 15 to 40 at % of carbon.

5. The image sensor device of claim 1, wherein the titanium carbon nitride layer comprises 15 to 40 at % of nitrogen.

6. The image sensor device of claim 1, wherein in the titanium carbon nitride layer, a difference between an amount of carbon and an amount of nitrogen is lower than or equal to 10 at %.

7. The image sensor device of claim 1, wherein in the titanium carbon nitride layer, an amount of titanium is greater than an amount of nitrogen.

8. The image sensor device of claim 1, wherein in the titanium carbon nitride layer, an amount of nitrogen is greater than an amount of carbon.

9. The image sensor device of claim 1, wherein the deep trench isolation further comprises a dielectric material between the corrosion resistive layer and an interior surface of the trench.

10. The image sensor device of claim 1, wherein the deep trench isolation further comprises a reflective material in the trench and over the corrosion resistive layer.

11. The image sensor device of claim 10, wherein the reflective material comprises tungsten.

12. The image sensor device of claim 10, wherein the corrosion resistive layer is disposed in the trench is in a conformal manner, and the reflective material fills the trench.

13. The image sensor device of claim 10, wherein the reflective material is in contact with the corrosion resistive layer.

14. An image sensor device, comprising:
a radiation sensing substrate having a front surface and a back surface, wherein a trench is defined by the radiation sensing substrate and extends from the back surface into the radiation sensing substrate;
a first dielectric layer in the trench; and
a corrosion resistive layer in the trench, wherein:
the corrosion resistive layer is a titanium carbon nitride layer, and
the first dielectric layer is disposed between a sidewall of the radiation sensing substrate defining the trench and a sidewall of the corrosion resistive layer.

15. The image sensor device of claim 14, further comprising:
a second dielectric layer overlying the radiation sensing substrate, the first dielectric layer, and the corrosion resistive layer.

16. The image sensor device of claim 15, wherein the second dielectric layer is in contact with a top surface of the corrosion resistive layer and a top surface of the first dielectric layer.

17. The image sensor device of claim 15, further comprising:
a reflective element overlying the second dielectric layer and at least partially overlying the corrosion resistive layer.

18. The image sensor device of claim 14, further comprising:
a reflective element at least partially overlying the corrosion resistive layer.

19. The image sensor device of claim 14, further comprising:
a reflective material in the trench, wherein the corrosion resistive layer is between the first dielectric layer and the reflective material.

20. An image sensor device, comprising:
a radiation sensing substrate having a front surface and a back surface, wherein a trench is defined by the radiation sensing substrate and extends from the back surface into the radiation sensing substrate;
a first dielectric layer in the trench;
a corrosion resistive layer in the trench, wherein:
the corrosion resistive layer is a titanium carbon nitride layer, and
the first dielectric layer is disposed between a sidewall of the radiation sensing substrate defining the trench and a sidewall of the corrosion resistive layer;
a reflective material in the trench, wherein the corrosion resistive layer is between the first dielectric layer and the reflective material; and
a second dielectric layer in contact with a top surface of the reflective material, a top surface of the corrosion resistive layer, and a top surface of the first dielectric layer.

* * * * *